US008994449B2

(12) United States Patent
Hodel et al.

(10) Patent No.: US 8,994,449 B2
(45) Date of Patent: Mar. 31, 2015

(54) ELECTRONIC CIRCUIT AND ELECTRONIC CIRCUIT ARRANGEMENT

(75) Inventors: Uwe Hodel, Munich (DE); Stephan Leuschner, Berlin (DE); Jan-Erik Mueller, Ottobrunn (DE)

(73) Assignee: Intel Mobile Communications GmbH, Neubiberg (DE)

( * ) Notice: Subject to any disclaimer, the term of this patent is extended or adjusted under 35 U.S.C. 154(b) by 516 days.

(21) Appl. No.: 12/690,009

(22) Filed: Jan. 19, 2010

(65) Prior Publication Data

US 2011/0018625 A1 Jan. 27, 2011

(51) Int. Cl.
H03H 11/24 (2006.01)
H01L 27/06 (2006.01)
H03F 1/22 (2006.01)
H03F 3/195 (2006.01)
H03F 3/24 (2006.01)

(52) U.S. Cl.
CPC ............ *H01L 27/0629* (2013.01); *H03F 1/223* (2013.01); *H03F 3/195* (2013.01); *H03F 3/245* (2013.01); *H03F 2200/61* (2013.01)

USPC ......................................................... 327/581

(58) Field of Classification Search
USPC ......................................................... 327/581
See application file for complete search history.

(56) References Cited

U.S. PATENT DOCUMENTS

| 5,032,799 | A  | * | 7/1991  | Milberger et al. | ............ | 330/311 |
| 6,496,074 | B1 | * | 12/2002 | Sowlati         | ........................ | 330/311 |
| 8,228,125 | B2 | * | 7/2012  | Heijden et al.  | ................ | 330/311 |
| 2002/0084855 | A1 | | 7/2002 | Kwon | | |
| 2005/0285684 | A1 | | 12/2005 | Burgener | | |

* cited by examiner

*Primary Examiner* — Sibin Chen
(74) *Attorney, Agent, or Firm* — Schwegman Lundberg & Woessner, P.A.

(57) ABSTRACT

In accordance with one exemplary embodiment, an electronic circuit is provided, wherein the electronic circuit comprises a first transistor and also a second transistor coupled in series with the first transistor. Furthermore, the electronic circuit comprises a capacitor, wherein a first terminal of the capacitor is coupled to a control terminal of the second transistor, and wherein a second terminal of the capacitor is coupled to an electrical potential which is dependent on a radio-frequency input signal of the electronic circuit.

25 Claims, 10 Drawing Sheets

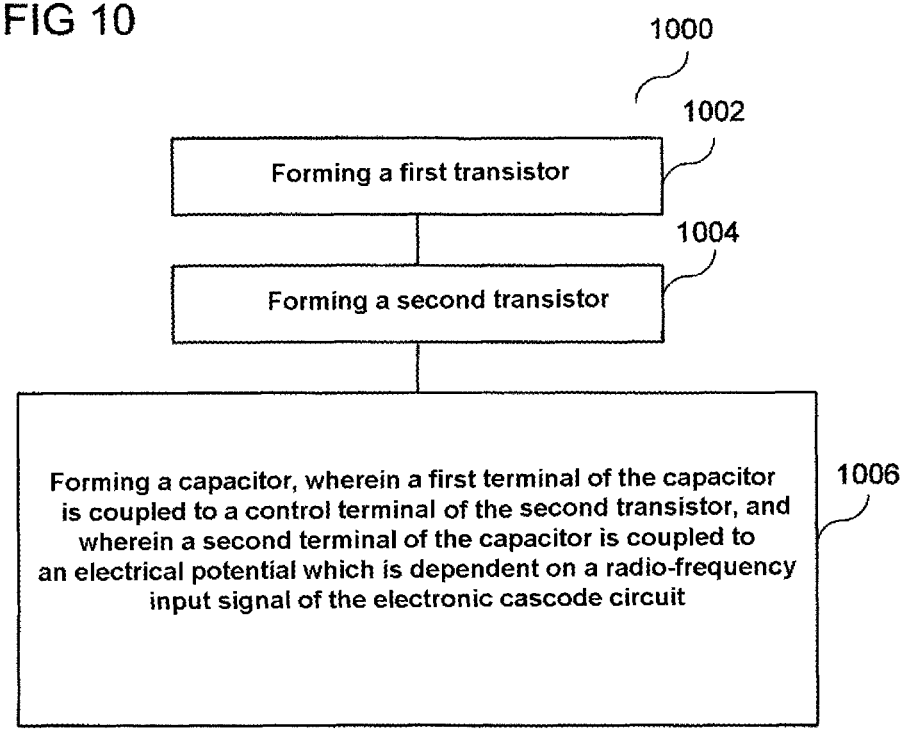

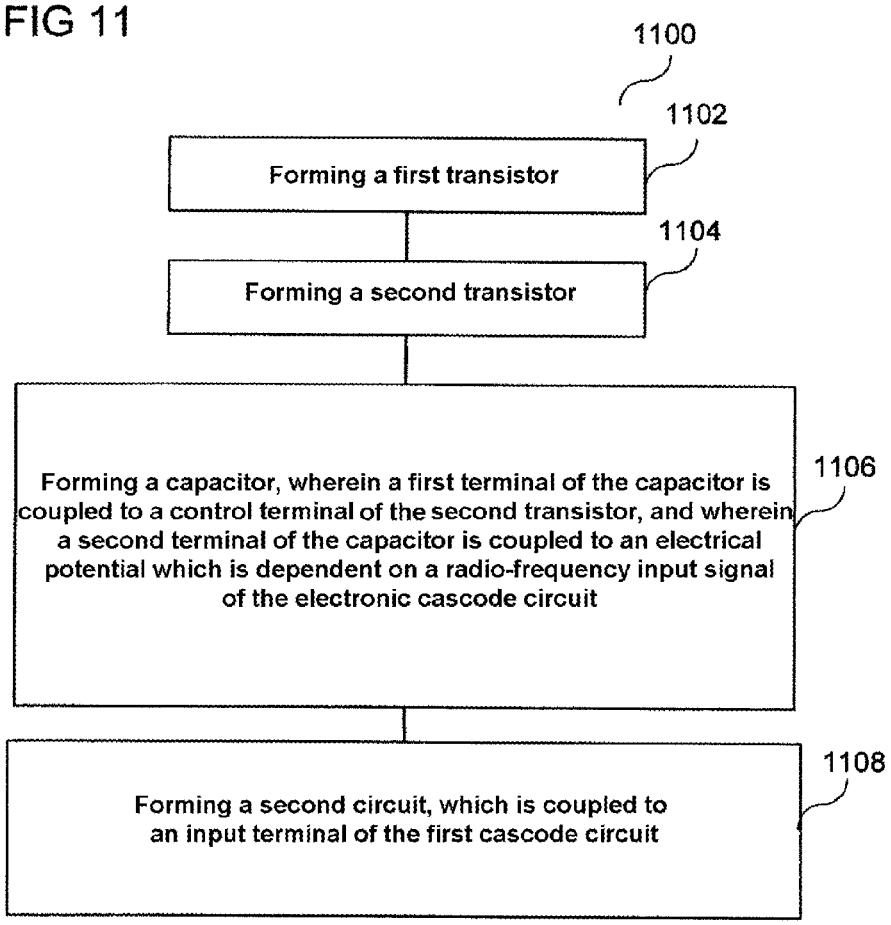

ELECTRONIC CIRCUIT AND ELECTRONIC CIRCUIT ARRANGEMENT

RELATED APPLICATIONS

This application claims priority of German Patent Application No. 102009005120.1, which was filed on Jan. 19, 2009. The entire contents of the German Application are incorporated herein by reference.

BACKGROUND

The general trend in integrated circuits for wireless communication is in the direction of a single chip radio device, with the aim of being able to integrate the required functions for wireless communication, in particular for baseband, radio-frequency transmitter/receiver device (radio-frequency transceiver), power management, and if possible also for the radio-frequency power amplifier, on a small chip, for example a small CMOS chip having structural geometry sizes in nanometer dimensions.

While the dielectric strength in modern CMOS technologies decreases from generation to generation and is already significantly lower than the operating voltage, the radio-frequency output powers required for the various communication standards are predefined and generally amount to 1 watt to approximately 3.5 watts.

Largely unresolved challenges include how, for example, the required radio-frequency output powers can be produced with such low-voltage transistor technologies without major additional technological or circuitry expenditure or how the different circuit sections can be supplied in a current-efficient manner and be connected directly to the supply voltage, for example to the battery. For transistors having a gate length in the submicron range, conventional silicon technologies usually do not offer the necessary transistor dielectric strength to realize power amplifiers for mobile radio applications with conventional circuit technologies, such as the use of simple cascode circuits, of transistor pairs or else of stacked, radio-frequency-decoupled transistors.

In this context one limiting factor—in addition to the (gate-drain) oxide breakdown—is the breakdown of pn junctions in the circuits. The breakdown voltage of the drain-side pn junction of the "topmost" transistor of a stacked transistor arrangement limits the maximum number of stacked transistors and hence the maximum permissible supply voltage and also the output power that can be achieved.

SUMMARY

In accordance with different exemplary embodiments, realizations of voltage-resistant transistor arrangements comprising transistors of relatively low breakdown voltage strength are provided which manage with low or even no additional technological outlay and low additional circuitry outlay and can be used, for example, in particular for modern scaled CMOS (complementary metal oxide semiconductor) technologies, BiCMOS technologies and SiGe technologies.

In accordance with one exemplary embodiment of the invention, an electronic cascode circuit is provided, which comprises a first transistor and a second transistor and also a capacitor, wherein a first terminal of the capacitor is coupled to a control terminal of the second transistor, and wherein a second terminal of the capacitor is coupled to an electrical potential which is dependent on a radio-frequency input signal of the electronic cascode circuit.

In one configuration of this exemplary embodiment, the first transistor and/or the second transistor are/is configured as field effect transistor or as bipolar transistor.

Furthermore, the first transistor and/or the second transistor can be configured as MOS field effect transistor, for example as a CMOS field effect transistor, as an MIS field effect transistor, or as any other suitable field effect transistor.

It should be noted that, although the exemplary embodiments described below are described in planar technology, the individual components can also be realized in a different technology, for example as vertical transistors or as fin transistors, for example as fin field effect transistors.

In another configuration, the cascode circuit comprises a substrate, a first well, doped with dopants of a first conductivity type, in the substrate, and also a second well, doped with dopants of a second conductivity type, which is different from the first conductivity type, wherein the second well is arranged in the first well. The first transistor and the second transistor are arranged in the second well.

In accordance with another configuration, the second terminal of the capacitor is coupled to the well potential of the second well.

Furthermore, the first conductivity type can be an n conductivity type, and the second conductivity type can be a p conductivity type. In this case, the first transistor and the second transistor can be n-channel field effect transistors.

In accordance with another configuration, the first conductivity type is a p conductivity type, and the second conductivity type is an n conductivity type. In this case, the first transistor and the second transistor can be p-channel field effect transistors.

In accordance with another configuration, the electronic cascode circuit comprises an additional capacitor, also referred to as tuning capacitor hereinafter, wherein a first terminal of the additional capacitor is coupled to the control terminal of the first transistor, and wherein a second terminal of the additional capacitor is coupled to an electrical reference potential, for example to the earth potential.

In accordance with another configuration of the electronic cascode circuit, the latter comprises a supply potential terminal for applying a supply potential (for example $V_{DD}$), wherein the supply potential terminal is electrically coupled to the first well, and is arranged for example in the first well.

In another exemplary embodiment, an electronic cascode circuit arrangement is provided, which comprises a first cascode circuit and a second circuit, which is coupled to an input terminal of the first cascode circuit. The first cascode circuit can have a structure such as has been described above.

The second circuit can be designed for receiving the radio-frequency input signal. Furthermore, the radio-frequency input signal processed or provided by the second circuit can be provided at the input terminal of the first cascode circuit.

In accordance with another configuration, the second circuit can have at least one transistor, wherein a control terminal of the at least one transistor is coupled to the radio-frequency input signal.

The second circuit can be a second cascode circuit.

The second cascode circuit can have a first transistor and also a second transistor and a capacitor, wherein a first terminal of the capacitor can be coupled to a control terminal of the second transistor, and wherein a second terminal of the capacitor can be coupled to an electrical reference potential, for example to the earth potential.

Furthermore, the control terminal of the first transistor of the second cascode circuit can be coupled to the radio-frequency input signal.

In accordance with another configuration, the first transistor of the second cascode circuit and/or the second transistor of the second cascode circuit can be configured as a field effect transistor or as bipolar transistor.

In accordance with yet another configuration of this exemplary embodiment, the first transistor of the second cascode circuit and/or the second transistor of the second cascode circuit can be configured as MOS field effect transistor, for example as CMOS field effect transistor or as MIS field effect transistor.

As described above, the first cascode circuit can be configured in accordance with the above-described exemplary embodiment with optionally one or more configurations such as have been described above.

For the case where a first well and a second well are provided, and the first transistor and the second transistor of the first cascode circuit are arranged in the second well, it can be provided that the second circuit is arranged outside the first well and outside the second well.

In various embodiments, both the electronic cascode circuit and the electronic cascode circuit arrangement can be used in any desired circuit structure and thus form different types of radio-frequency circuits; thus, by way of example, the electronic cascode circuit arrangement can be designed as a circuit arrangement of a type selected from a group of types consisting of:
  radio-frequency power amplifier circuit;
  low noise amplifier circuit (LNA);
  voltage-controlled oscillator circuit (VCO);
  DC voltage converter circuit (DC converter circuit).

In accordance with another exemplary embodiment of the invention, an electronic circuit is provided, which comprises a first transistor and also a second transistor coupled in series with the first transistor, and a capacitor, wherein a first terminal of the capacitor is coupled to the control terminal of the second transistor, and wherein a second terminal of the capacitor is coupled to an electrical potential which is dependent on a radio-frequency input signal of the electronic circuit.

In accordance with one configuration, the first transistor and/or the second transistor are/is configured as field effect transistor(s) or as bipolar transistor(s).

Furthermore, the first transistor and/or second transistor can be configured as MOS field effect transistor(s), alternatively as MIS field effect transistor(s).

In accordance with yet another configuration, the electronic circuit additionally has a substrate and also a first well, doped with dopants of a first conductivity type, in the substrate, and a second well, doped with dopants of a second conductivity type, which is different from the first conductivity type, wherein the second well is arranged in the first well. The first transistor and the second transistor are arranged in the second well.

Furthermore, the second terminal of the capacitor can be coupled to the well potential of the second well.

In accordance with another configuration, the first conductivity type can be an n conductivity type, and the second conductivity type can be a p conductivity type. In this configuration, the first transistor and the second transistor can be n-channel field effect transistors.

In accordance with another configuration, the first conductivity type can be a p conductivity type, and the second conductivity type can be an n conductivity type. In accordance with this configuration, the first transistor and the second transistor can be p-channel field effect transistors.

In addition, an additional capacitor can be provided in the electronic circuit, wherein a first terminal of the additional capacitor is coupled to a control terminal of the first transistor, and wherein a second terminal of the additional capacitor is coupled to an electrical reference potential, for example to the earth potential.

In accordance with another configuration, the electronic circuit has a supply potential terminal for applying a supply potential, wherein the supply potential terminal is electrically coupled to the first well, and is arranged for example in the first well.

In accordance with another exemplary embodiment, an electronic circuit arrangement is provided, comprising a first circuit and a second circuit, which is coupled to an input terminal of the first circuit. The first circuit can have a structure as described above, optionally in accordance with one or more of the configurations described above.

Furthermore, the second circuit can be designed for receiving the radio-frequency input signal. The radio-frequency input signal or the processed radio-frequency input signal can be provided by the second circuit to the first circuit at the input terminal thereof.

The second circuit can have at least one transistor, wherein a control terminal of the at least one transistor is coupled to the radio-frequency input signal.

Furthermore, the second circuit can have a first transistor, a second transistor coupled in series with the first transistor, and also a capacitor, wherein a first terminal of the capacitor is coupled to a control terminal of the second transistor, and wherein a second terminal of the capacitor is coupled to an electrical reference potential.

The control terminal of the first transistor of the second circuit can be coupled to the radio-frequency input signal.

Furthermore, the first transistor of the second circuit and/or the second transistor of the second circuit can be configured as field effect transistor(s) or as bipolar transistor(s).

In accordance with another configuration of this exemplary embodiment, the first transistor of the second circuit and/or the second transistor of the second circuit can be configured as MOS field effect transistor(s), alternatively as MIS field effect transistor(s).

For the case where the first circuit has a first well and also a second well and the first transistor of the first circuit and the second transistor of the first circuit are arranged in the second well, it can be provided that the second circuit is arranged outside the first well and outside the second well.

In accordance with yet another exemplary embodiment, a method for producing an electronic cascode circuit is provided, wherein a first transistor is formed, and wherein a second transistor is formed. Furthermore, a capacitor is formed, wherein a first terminal of the capacitor is coupled to a control terminal of the second transistor, and wherein a second terminal of the capacitor is coupled to an electrical potential which is dependent on a radio-frequency input signal of the electronic cascode circuit.

In accordance with another exemplary embodiment, a method for producing an electronic cascode circuit arrangement is provided, wherein a first cascode circuit and a second cascode circuit are formed. The process of forming the first cascode circuit comprises forming a first transistor and forming a second transistor. Furthermore, in order to form the first cascode circuit, a capacitor is formed, wherein a first terminal of the capacitor is coupled to a control terminal of the second transistor, and wherein a second terminal of the capacitor is coupled to an electrical potential which is dependent on a radio-frequency input signal of the electronics cascode circuit. Furthermore, the second circuit is formed in such a way that it is coupled to an input terminal of the first cascode circuit.

BRIEF DESCRIPTION OF THE DRAWINGS

Exemplary embodiments of the invention are illustrated in the figures and are explained in more detail below.

In the context of this description, identical reference symbols are used, as far as is expedient, for identical or similar elements. The figures are not necessarily true to scale; instead, importance has been attached to elucidating the principles on which the exemplary embodiments are based.

In the figures:

FIG. 1 shows a circuit in accordance with one exemplary embodiment.

FIG. 2 shows a circuit arrangement in accordance with one exemplary embodiment.

FIG. 3 shows a cross-sectional view of a cascode circuit arrangement in accordance with one exemplary embodiment;

FIG. 4 shows a cascode circuit arrangement in accordance with one exemplary embodiment.

FIG. 5 shows a diagram illustrating a basic profile of the drain potentials of the transistors of the circuit arrangement in accordance with FIG. 4.

FIG. 6 shows a circuit arrangement in accordance with one exemplary embodiment.

FIG. 7 shows a circuit arrangement in accordance with another exemplary embodiment.

FIG. 8 shows a circuit arrangement in accordance with another exemplary embodiment.

FIG. 9 shows a circuit arrangement in accordance with another exemplary embodiment.

FIG. 10 shows a flowchart illustrating a method for producing a circuit arrangement in accordance with one exemplary embodiment.

FIG. 11 shows a flowchart illustrating a method for producing a circuit arrangement in accordance with one exemplary embodiment.

DETAILED DESCRIPTION

In the context of this description here the expressions "connected" and "coupled" are used to describe both a direct and an indirect connection, and a direct or indirect coupling. In the figures, identical or similar elements are provided with identical reference symbols, as far as is expedient.

Figure 1:
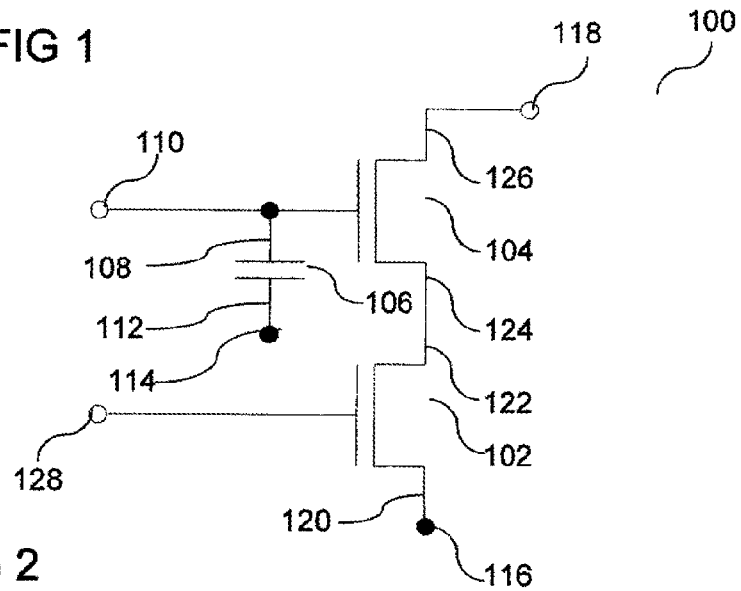

FIG. 1 shows an electronic circuit 100, for example an electronic cascade circuit 100, in accordance with one exemplary embodiment.

The electronic circuit 100 comprises a first transistor 102, for example a first MOS field effect transistor 102, a second transistor 104, for example a second MOS field effect transistor 104, and also a capacitor 106, also referred to as blocking capacitor 106 hereinafter. A first terminal 108 of the capacitor 106 is coupled to a control terminal 110 of the second transistor 104, for example to the gate terminal 110 of the second MOS field effect transistor 104, and a second terminal 112 of the capacitor 106 is coupled to an electrical potential 114 which is dependent on a radio-frequency input signal of the electronic circuit 100, for example of the electronic cascade circuit 100. The electronic circuit 100 furthermore has an input terminal 116 and also an output terminal 118, wherein a signal dependent on the radio-frequency input signal of the electronic cascade circuit can be fed to the input terminal 116. In one exemplary embodiment, the second terminal 112 of the capacitor 106 is coupled to the input terminal 116 of the electronic circuit 100, such that these two terminals or nodes are at the same electrical potential.

A first controlled terminal 120, for example the source terminal 120 of the first transistor 102, for example of the first MOS field effect transistor 102, is coupled to the input terminal 116 and a second controlled terminal 122, for example the drain terminal of the first transistor 102, for example of the first MOS field effect transistor 102, is coupled to a first controlled terminal 124 of the second transistor 104, for example to the source terminal 124 of the second MOS field effect transistor 104, and a second controlled terminal 126 of the second transistor 104, thus for example the drain terminal 126 of the second MOS field effect transistor 104, is coupled to the output terminal 118 of the electronic circuit 100.

Furthermore, the first transistor 102 has a control terminal 128, for example a gate terminal 128 in the case where the first transistor 102 is a MOS field effect transistor.

Figure 2:
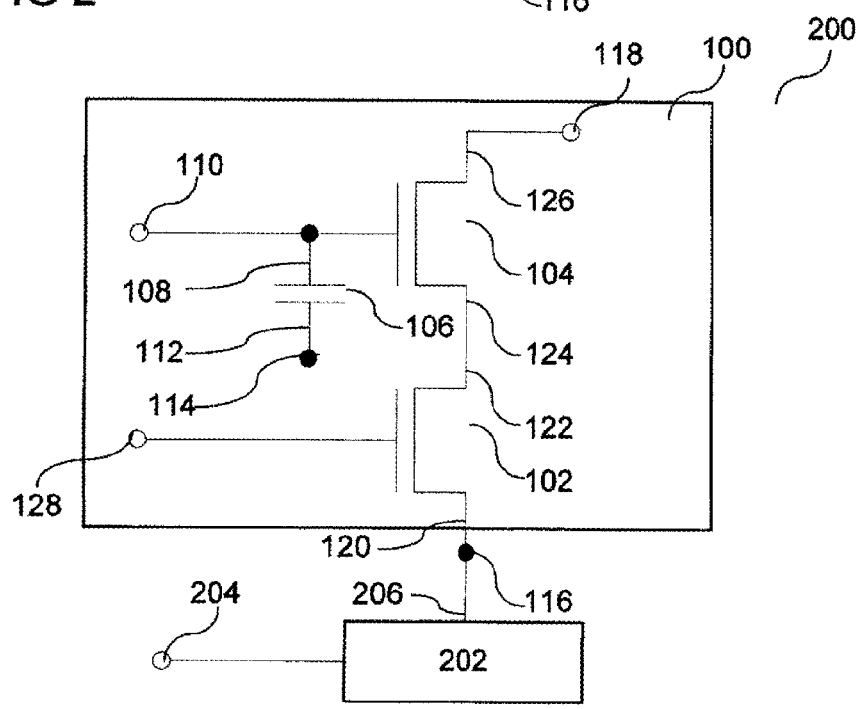

FIG. 2 shows an electronic circuit arrangement 200, for example an electronic cascode circuit arrangement 200, in accordance with one exemplary embodiment. The circuit arrangement comprises a first cascode circuit such as is illustrated in FIG. 1, for example, as cascode circuit 100, and also a second circuit 202.

Various configurations of the second circuit 202 are explained in more detail below.

Generally, a radio-frequency input signal 204 is coupled into the second circuit, and processed there, for example—as is explained in more detail below—applied to a control terminal of a transistor, and an output signal of the second circuit 202 is provided at an output terminal 206 of the second circuit 202, which is coupled to the input terminal 116 of the first circuit 100.

Even though MOS field effect transistors are used in the following exemplary embodiments, it should be pointed out that, in alternative exemplary embodiments, the transistors can also become bipolar transistors (in this case, the following should be replaced in each case in the circuits: a source terminal of a field effect transistor by an emitter terminal of a bipolar transistor, a drain terminal of a field effect transistor by a collector terminal of a bipolar transistor, and a gate terminal of a field effect transistor by a base terminal of a bipolar transistor) or other types of field effect transistors, for example MIS field effect transistors.

Figure 3:
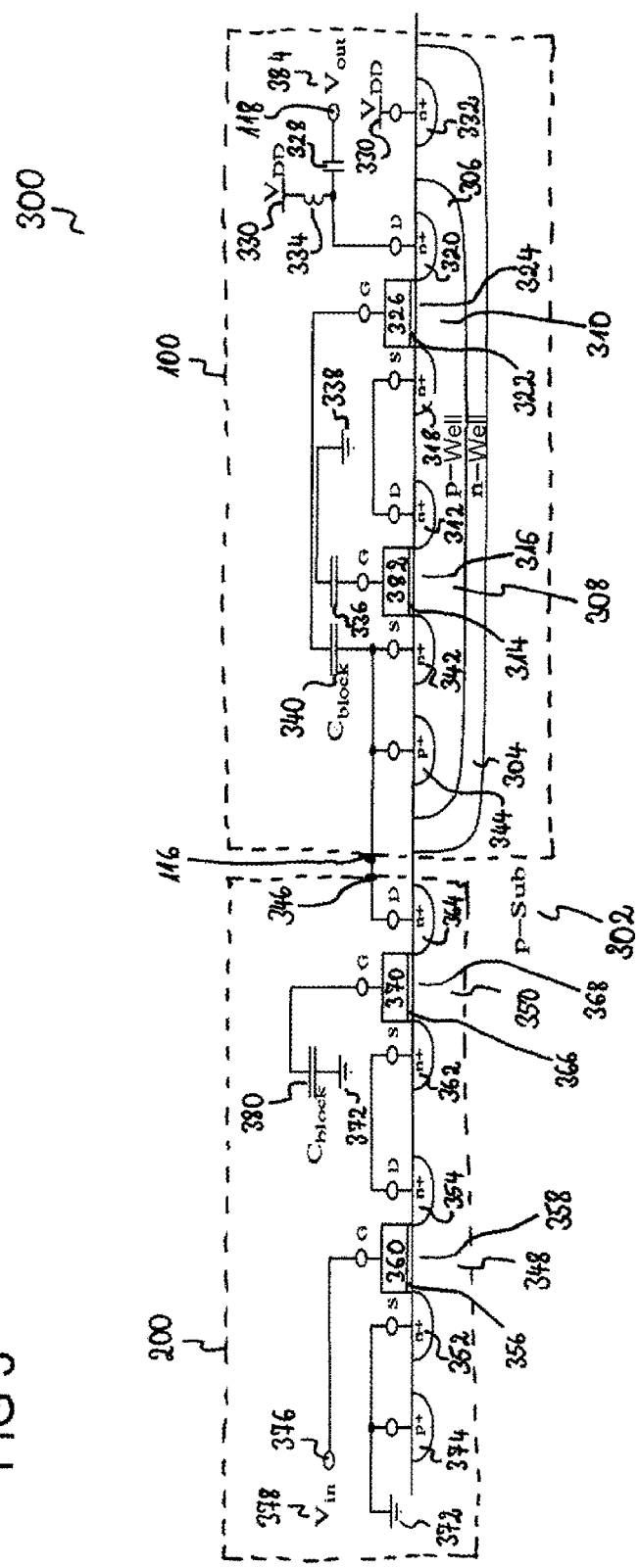

FIG. 3 shows a circuit arrangement 300, for example a cascode circuit arrangement 300 in accordance with one exemplary embodiment.

It has been recognized that the maximum output voltage that occurs in an electronic circuit comprising stacked transistors should be suitably distributed both over the individual pn junctions and over the individual gate sections of the transistor arrangement, generally of the circuit arrangement, in order to be able to arrange more than two transistors stacked in the circuit arrangement 300.

The cross-sectional view of the circuit arrangement 300 as illustrated in FIG. 3 illustrates that the circuit arrangement 300 comprises a substrate 302, for example a p-type substrate, that is to say, in other words, a semiconductor substrate doped with p conductivity type dopants, for example a substrate comprised of silicon.

In one exemplary embodiment, the substrate 302 can be produced from a semiconductor material of various types, for example from silicon, germanium, silicon-germanium, from a group III semiconductor material and/or from a group V semiconductor material or from a compound semiconductor material, as will be described in even greater detail below, or from other types, including polymers. In alternative exemplary embodiments, a different type of substrate 302 can be provided. It should be pointed out that the different embodiments can be provided in any desired substrate, in so far as the first circuit 100 can be arranged in a separate well, for example; in other words if the first circuit 100 can have applied to it a potential which is different from the potential and can be set separately from the potential of the substrate 302. In one exemplary embodiment, the substrate 302 can be produced from silicon (doped or undoped), and, in an alternative exemplary embodiment, the substrate 302 is a silicon-on-insulator (SOI) substrate. As an alternative, any other suitable semiconductor material can be used for the substrate 302, for example a compound semiconductor material such as, for example, gallium arsenide (GaAs) indium phosphide (InP), but also any other suitable ternary compound semiconductor material or quaternary compound semiconductor material such as indium gallium arsenide (InGaAs), for example.

The electronic circuit 300 has an implementation of the first circuit 100 and also an implementation of the second circuit 200.

As is illustrated in FIG. 3, a first well 304, for example an n-type well (for the case where the substrate 302 is p-doped), is provided for the first circuit 100. A second well 306 is implanted within the first well 304, wherein the second well is doped with dopants of a conductivity type opposite to the conductivity type of the dopants used for doping the first well 304. In the case where the first well 304 is an n-type well, in other words an n-doped well, the second well 306 is thus a p-type well, in other words a p-doped well. A first n-channel MOS field effect transistor 308 and a second n-channel MOS field effect transistor 310 connected in series therewith are arranged in the second well 306.

The first n-channel MOS field effect transistor 308 has a first source/drain region 342, for example a source region 342, and also a second source/drain region 312, for example a drain region 312, and also a gate insulation layer 314, arranged on or above a body region 316, which is arranged between the first source/drain region 342 and the second source/drain region 312, and in which, when a corresponding potential is applied to the source/drain regions 342, 312 and also to a gate region 382 described below, a channel is formed between the first source/drain region 342 and the second source/drain region 312. The gate region 382, for example composed of polysilicon, is provided on or above the gate insulation layer 314.

The second n-channel MOS field effect transistor 310 has a first source/drain region 318, for example the source region 318, and also a second source/drain region 320, for example the drain region 320, and also a gate insulation layer 322, arranged on or above the body region 324 of the second n-channel MOS field effect transistor 310, and a gate region 326 on or above the gate insulation layer 322.

The drain region 312 of the first n-channel MOS field effect transistor 308 is coupled to the source terminal 318 of the second n-channel MOS field effect transistor 310, such that the two n-channel MOS field effect transistors 308, 310 are coupled in series with one another.

The drain terminal 320 of the second n-channel MOS field effect transistor 310 is furthermore coupled to the output terminal 118 directly, alternatively by means of an output capacitor 328. Furthermore, a supply potential terminal 330 is provided, to which an operating potential $V_{DD}$ is applied. The supply potential terminal 330 is firstly coupled to a separate diffusion region 332 of the first conductivity type, for example $n^+$-doped, arranged in the first well 304, and is secondly coupled by means of an inductance 334 to the drain region 320 of the second n-channel MOS field effect transistor 310 and also to a first terminal of the output capacitor 328, the second terminal of which is coupled to the output terminal 118 of the electronic circuit 100.

In an alternative embodiment, it can be provided that the separate diffusion region 332 is coupled to the input terminal 116, such that the first well 304 and the second well 306 are at the same electrical potential.

Furthermore, the gate region 382 of the first n-channel MOS field effect transistor 308 is coupled to a first terminal of a tuning capacitor 336 having a capacitance $C_{Tuning}$, the second terminal of which is coupled to a reference potential, for example to the earth potential 338.

In one exemplary embodiment, the tuning capacitor 336 has a capacitance $C_{Tuning}$ of approximately 1 pF.

In one exemplary embodiment, the capacitance $C_{Tuning}$ of the tuning capacitor 336 is dimensioned in accordance with the following specification:

$$C_{Tuning} = \frac{C_{GS1}}{\frac{1}{\frac{1}{2}g_m R_L + 1}}$$

where
$C_{GCs1}$ denotes the capacitance between the gate region 382 of the first n-channel MOS field effect transistor 308 and the source region 312 of the first n-channel MOS field effect transistor 308;
$g_m$ denotes a transconductance of the first n-channel MOS field effect transistor 308;
$R_L$ denotes a resistance value of a load circuit connected to the output terminal 118 of the electronic circuit 100.

The capacitance $C_{Tuning}$ of the tuning capacitor 336 together with the gate-source capacitance $C_{GS1}$ of the first n-channel MOS field effect transistor 308 clearly determines the voltage oscillation at the gate regions 382, 326 of the first n-channel MOS field effect transistor 308 and of the second n-channel MOS field effect transistor 310 and also at the p-type well node or the source region 342 of the first n-channel MOS field effect transistor 308.

With a dimensioning of the capacitance $C_{Tuning}$ of the tuning capacitor 326, the maximum gate-drain voltage of the second n-channel MOS field effect transistor 310 and the voltages at the pn junctions are kept below their respective breakdown voltages, even though the supply voltage $V_{DD}$ and the maximum output voltage of the first circuit 100 exceed the values maximally provided for an individual n-channel MOS field effect transistor.

In one example, the value $g_m$ can be 48 mS, the value for $C_{GS1}$ can be 3 pF, and the value for $R_L/2$ can be 89Ω, such that the value of the capacitance $C_{Tuning}$ of the tuning capacitor 336 can be 0.9 pF for this case.

It should be pointed out in this connection that the values presented by way of example above can vary greatly depending, inter alia, on the technology respectively used, the type of transistors, for example the gate width (in the case where field effect transistors are used), the application, the circuit type, etc.

Furthermore, in accordance with this implementation, the gate region 326 of the second n-channel MOS field effect transistor 310 has feedback coupling via a first blocking capacitor 340 to the input terminal 116 of the first cascode circuit 100 and to the source region 242 of the first n-channel MOS field effect transistor 308. In other words, this means that the gate region 326 of the second n-channel MOS field effect transistor 310 is connected to a first terminal of the first blocking capacitor 340, the second terminal of which is coupled to the source region 342 of the first n-channel MOS field effect transistor 308. Furthermore, the second terminal of the first blocking capacitor 340 and hence the source region 342 of the first n-channel MOS field effect transistor 308 are coupled to a highly doped diffusion region 344 arranged in the second well 306, wherein the highly doped diffusion region 344 is doped with dopants of a conductivity type opposite to the conductivity type of the diffusion regions of the field effect transistors arranged in the second well 306. In this example, the highly doped diffusion region 344 is a p⁺-doped diffusion region.

In one exemplary embodiment, the highly doped diffusion regions, for example the source/drain regions 342, 312, 318, 320 of the n-channel MOS field effect transistors 308, 310 are highly n-doped (n⁺-doped), for example with a dopant concentration in a range of $10^{19}$ cm$^{-3}$ to approximately $10^{21}$ cm$^{-3}$, for example approximately $10^{20}$ cm$^{-3}$.

The highly doped diffusion region 344 can be doped with a dopant concentration in a range of approximately $10^{19}$ cm$^{-3}$ to approximately $10^{21}$ cm$^{-3}$, for example approximately $10^{20}$ cm$^{-3}$.

Clearly, in accordance with this exemplary embodiment, therefore, the second terminal of the first blocking capacitor 340 is not coupled to the earth potential, as in a conventional manner, but rather to an electrical potential dependent on the input signal, for example to the electrical potential present at the input terminal 116 of the first cascode circuit 100, whereby the gate potential present at the gate region 326 of the second n-channel MOS field effect transistor 310 clearly "resonates" with the output potential $V_{OUT}$ of the circuit arrangement 300, as will be explained in even greater detail below.

The input terminal 116 of the first cascode circuit 100 is coupled to an output terminal 346 of the second circuit 200, which is implemented as a second cascode circuit 200 in this example.

The second cascode circuit 200 has a third n-channel MOS field effect transistor 348 and a fourth n-channel MOS field effect transistor 350, wherein the third n-channel MOS field effect transistor 348 and the fourth n-channel MOS field effect transistor 350, generally the circuit components of the second circuit 200, are arranged outside the first well 304 and outside the second well 306.

The third n-channel MOS field effect transistor 348 can have:
- a first source/drain region 352, for example a source region 352;
- a second source/drain region 354, for example a drain region 354;
- a gate insulation layer 356, arranged on or above a body region 358, which is arranged between the first source/drain region 352 and the second source/drain region 354; and
- a gate region 360, arranged on or above the gate insulation layer 356.

The fourth n-channel MOS field effect transistor 350 can have:
- a first source/drain region 362, for example a source region 362;
- a second source/drain region 364, for example a drain region 364;
- a gate insulation layer 366, arranged on or above a body region 368, which is arranged between the first source/drain region 362 and the second source/drain region 364; and
- a gate region 370, arranged on or above the gate insulation layer 366.

The first source/drain region 352 of the third n-channel MOS field effect transistor 348 is coupled for example to a predefined reference potential 372, for example to the earth potential 372. Furthermore, the first source/drain region 352 of the third n-channel MOS field effect transistor 348 can be coupled to a further highly doped diffusion region 374, doped in accordance with a conductivity type opposite to the conductivity type of the first source/drain region 352 of the third n-channel MOS field effect transistor 348.

Furthermore, the second source/drain region 354 of the third n-channel MOS field effect transistor 348 is coupled to the first source/drain region 362 of the fourth n-channel MOS field effect transistors 350; in other words, the two n-channel MOS field effect transistors 348, 350 of the second cascode circuit are coupled in series with one another. Furthermore, the gate region 360 of the third n-channel MOS field effect transistor 348 is coupled to a gate terminal and, via the latter, to an input signal terminal 376, to which a radio-frequency input signal $V_{in}$ 378 can be applied.

Furthermore, the gate region 370 of the fourth n-channel MOS field effect transistor 350 is coupled to the predefined reference potential 372 via a second blocking capacitor 380 having the capacitance $C_{block}$; in other words, a first terminal of the second blocking capacitor 380 is coupled to the gate region 370 of the fourth n-channel MOS field effect transistor 350 and a second terminal of the second blocking capacitor 380 is coupled to the reference potential 372. In one exemplary embodiment, the value of the capacitance $C_{block}$ of the blocking capacitors 340, 380 is dimensioned in such a way that the second n-channel MOS field effect transistor 310 and the fourth n-channel MOS field effect transistor 350 operate as cascode transistors. The gate voltages at the n-channel MOS field effect transistors 310, 350 should have an RF amplitude which should be kept as small as possible with respect to the reference potential. In the case of the fourth n-channel MOS field effect transistor 350, this means, for example, that the gate terminal 370 thereof is blocked relative to the earth potential 372 by means of the second blocking capacitor 380. In the case of the second n-channel MOS field effect transistor 310, this means, for example, that the gate terminal 326 thereof is blocked relative to the source potential present at the source region 342 of the first n-channel MOS field effect transistor 308 (which is equal to the well potential of the p-doped well 306) by means of the first blocking capacitor 340.

As can be gathered from the illustration of the circuit arrangement 300 in FIG. 3, the largest electrical voltage during operation of the circuit arrangement 300 occurs at the drain node, in other words at the drain region 320, of the second n-channel MOS field effect transistor 310.

In accordance with one exemplary embodiment, the first cascode circuit 100, also referred to as "upper" cascode circuit, is realized within a "well-in-well" structure (in this exemplary embodiment for example a p-doped well 306 within an n-doped well 304).

In one exemplary embodiment, as a result of the above-described feedback coupling of the gate region 382 of the first n-channel MOS field effect transistor 308, generally as a result of the coupling of the control terminal of the first transistor to an electrical reference potential by means of a tuning capacitor, it is ensured that the potential of the second well 306 for example, of the p-type well for example, suitably resonates (for example by means of the tuning capacitor 340) with the output voltage $V_{OUT}$ 384 provided at the output terminal 118 of the first cascode circuit 100, and it becomes possible to set the maximum reverse voltages that occur at the various pn junctions to the supply voltage $V_{DD}$ and the maximum voltages across the gate oxide sections to half the supply voltage $V_{DD}/2$.

The capacitance $C_{block}$ of the first blocking capacitor 340 and/or of the second blocking capacitor 380 should be significantly greater than the gate-source capacitance of the transistor (e.g. 310, 350) that is respectively to be blocked, for example by at least a factor of 10. The capacitances $C_{block}$ of the first blocking capacitor 340 and/or of the second blocking capacitor 380 can be different, but they can also have the same value.

Figure 4:
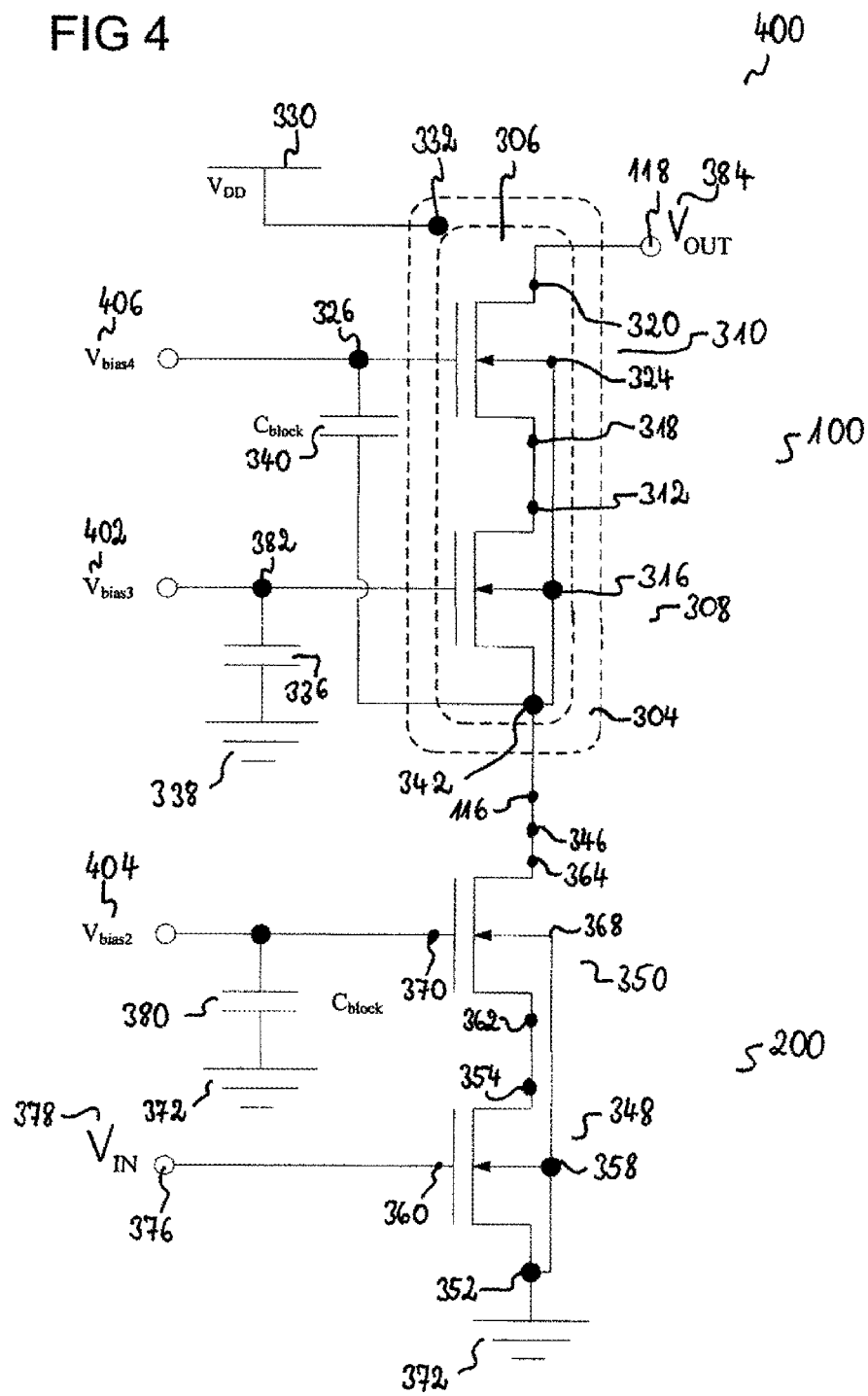

FIG. 4 shows the associated equivalent circuit diagram 400 of the stacked cascode circuit 300 from FIG. 3, which in this example consists of two cascode circuits 100, 200 or comprises two cascode circuits 100, 200. As described above, the first transistor 308, for example the first n-channel MOS field effect transistor 308, and the second transistor 310, for example the second n-channel MOS field effect transistor 310, form a first cascode circuit 100, and the third transistor 348, for example the third n-channel MOS field effect transistor 348, and the fourth transistor 350, for example the fourth n-channel MOS field effect transistor 350, form a second cascode circuit 200.

In order to reduce the high voltage loading at the drain node, in other words at the drain region 320 of the second transistor 310, for example of the second n-channel MOS field effect transistor 310, the voltage is divided between the drain diffusion, that is to say the drain region 320 of the second n-channel MOS field effect transistor 310, the second well 306 (for example the p-doped well 306) and the first well (for example the n-doped well 304). In accordance with one exemplary embodiment, the first well 304 (for example the n-doped well 304) is fixedly put at the potential of the supply voltage $V_{DD}$, for example by means of the highly doped region 332 arranged in the first well 304.

The potential of the p-type well, that is to say of the second well 308, is therefore intended not to exceed the value $V_{DD}+V_{Diode}$ ($V_{Diode}$ denotes the breakdown voltage of the pn diode formed by the pn junction between the second well 306 and the first well 304).

However, the output voltage $V_{OUT}$ 382 provided at the output terminal 118 of the first cascode circuit 100 should also not become smaller than the electrical potential of the second well 306, for example of the p-doped well 306. Therefore, in accordance with one exemplary embodiment, the electrical potential of the p-type well 306, that is to say of the second well 306, should oscillate between the earth potential, generally between a fixedly predefined reference potential, and the supply potential $V_{DD}$.

In this case, the maximum voltage present across the drain-side pn junction of the second n-channel MOS field effect transistor 310 is $V_{DD}$ (for the case where $V_{OUT}=2*V_{DD}$ holds true) and the maximum voltage present at the pn junction between the second well 306 (for example the p-doped well 306) and the first well 304 (for example the n-doped well 304) is likewise $V_{DD}$ (for the case where $V_{OUT}=0$ holds true).

The resonance of the electrical potential of the second well 306, that is to say of the p-doped well 306 for example, is realized using the tuning capacitor 336 having the capacitance $C_{Tuning}$, which together with at least one other capacitor present in this arrangement (for example the gate-source capacitance of the transistor coupled to the tuning capacitor 336) forms a capacitive voltage divider.

A strong capacitive coupling of the gate region 382 of the first n-channel MOS field effect transistor 308 to the earth potential 338 by means of the tuning capacitor 336 having the capacitance $C_{Tuning}$ results in a small oscillation amplitude of the gate potential present at the gate region 382 of the first n-channel MOS field effect transistor 308 since the tuning capacitor 336 having the capacitance $C_{Tuning}$ in this case constitutes the smaller impedance in the capacitance voltage divider $C_{Tuning}/C_{GS1}$ ($C_{GS1}$ denotes the gate-source capacitance of the first n-channel MOS field effect transistor 308). Consequently, the oscillation amplitude of the potential of the second well 306, for example of the p-type well 306, is also reduced. A weaker coupling increases the oscillation amplitude.

The operating point voltage of the first n-channel MOS field effect transistor 308, also designated as $V_{bias3}$ 402 in FIG. 4, and the value of the capacitance $C_{Tuning}$ of the tuning capacitor 336 are chosen, in accordance with one exemplary embodiment, in such a way that the potential of the second well 306, that is to say of the p-type well 306 for example, also designated as $V_{pWell}$, which is equal to the potential of the drain region 364 of the fourth n-channel MOS field effect transistor 350, oscillates about a voltage $V_{DD}/2$ or, for example, $V_{outmax}/2$ with an amplitude $V_{DD}/2$.

The operating point voltage $V_{bias3}$ 402 should be connected with a high resistance to the control terminal of the first transistor 308, for example to the gate region 382 of the first n-channel MOS field effect transistor 308, for example by means of a large non-reactive resistance, in order that the capacitance $C_{Tuning}$ of the tuning capacitor 336 determines the function of the circuit (rather than the bias circuit, for instance).

Furthermore, in accordance with one exemplary embodiment, provision is made also for biasing the gate terminal 326 of the second n-channel MOS field effect transistor 310 with a gate bias voltage $V_{bias4}$ 406, and also for biasing the gate terminal 370 of the fourth n-channel MOS field effect transistor 350 with a gate bias voltage $V_{bias2}$ 404.

In one implementation, the gate bias voltages can be chosen in the following manner:

$V_{bias2}$ approximately $V_{outmax}/4$, where $V_{outmax}$ denotes a maximum output voltage of the first circuit 100;

$V_{outmax}/4 < V_{bias3} < V_{outmax}/2$; for example approximately $3/8*V_{outmax}$;

$V_{bias4}$ approximately $V_{outmax}/2$.

Furthermore, the potential of the n-type well 304 can be set to approximately $V_{outmax}/2$.

In order to ensure a proper function of the cascode circuits 100, 200, the gate regions 370, 326 of the cascode transistors 350, 310 should be terminated with a low-resistance impedance—that is to say a large capacitance for example. This is done by means of the blocking capacitors 340, 380. The gate region 370 of the fourth transistor 350, for example of the fourth n-channel MOS field effect transistor 350, is coupled to the reference potential, for example the earth potential 372, by means of the second blocking capacitor 380 having the capacitance $C_{block}$. The gate region 326 of the second transistor 310, for example of the second n-channel MOS field effect transistor 310, is coupled to the potential of the second well 306, for example of the p-doped well 306, such that the first transistor 308 and the second transistor 310 operate as cascode circuit relative to this potential, but the potential at the gate region 326 of the second transistor 310 oscillates relative to the output potential $V_{OUT}$ 384.

Figure 5:
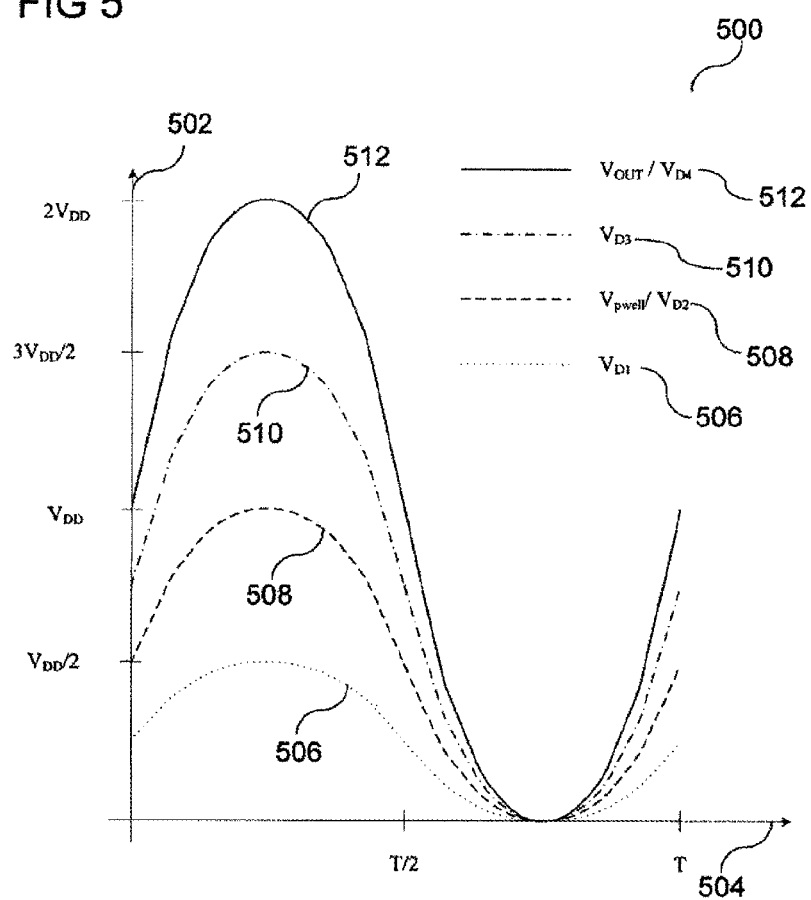

FIG. 5 shows a voltage diagram 500 having a voltage axis 502, along which various voltage profiles are illustrated against a time axis 504 of the voltage diagram 500. The voltage diagram 500 illustrates the temporal profile—arising for the different voltages—of the different potentials in the case of sinusoidal modulation, in other words when a sinusoidal radio-frequency input signal is applied. Specifically, a first curve 506 illustrates the potential profile of the electrical potential $V_{D1}$ at the drain region 364 of the third transistor 348, for example of the third n-channel MOS field effect transistor 348. A second voltage profile 508 describes the profile of the electrical potential $V_{pWell}$ or $V_{D2}$ in the second well 306, for example the p-doped well 306, and thus at the drain region 364 of the fourth transistor 350, for example of the fourth n-channel MOS field effect transistor 350. A third curve 510 describes the profile of the electrical potential $V_{D3}$ at the drain region 312 of the first transistor 308, for example of the first n-channel MOS field effect transistor 308, and a fourth curve 512 describes the profile of the electrical potential $V_{OUT}$ or $V_{D4}$ at the drain region 320 of the second transistor 310, for example of the second n-channel MOS field effect transistor 310, and thus at the output terminal 118 of the first cascode circuit 100.

The potential profile reveals that the potential present at the drain region 320 of the second transistor 310 fluctuates between the supply potential $V_{DD}$ and the value of twice the supply potential ($2*V_{DD}$), but never exceeds said value of twice the supply potential ($2*V_{DD}$) nor falls below the supply potential $V_{DD}$. This is the above-described desired profile of the potential at the drain region 320 of the second transistor 310, for example of the second n-channel MOS field effect transistor 310.

As a result of the use of insulation wells such as have been described above, for example the first well 304 or the second well 306, or the wells such as are described below, the stacking of transistors having a low breakdown voltage and also circuit measures aimed at a suitably constrained voltage division both in static and in dynamic operation, such as have been described above and will also be explained in even greater detail below, a voltage-resistant arrangement is thus realized.

This results in the following effects, inter alia, for example in accordance with different exemplary embodiments:

A transistor arrangement in accordance with the different exemplary embodiments can be connected to operating voltages which are significantly higher than the breakdown voltage of the transistors used.

The required optimum load impedance for a given radio-frequency output power is significantly higher than it would be for the individual transistor having a lower breakdown voltage.

A higher output power and also an improved efficiency are achieved in accordance with different exemplary embodiments since the losses in the matching network are considerably lower in comparison with the individual transistor.

It is furthermore possible to provide a reserve in the dielectric strength in the circuit arrangement, such that excessive voltage increases, for example occurring on account of a mismatch at the output of a power amplifier circuit, are coped with by the circuit.

It should be pointed out that the cascode circuit and also the cascode circuit arrangement described above are not limited in their application to a radio-frequency power amplifier, but rather can readily be used in different circuits such as, for example, a low noise amplifier (LNA) circuit, a mixer circuit, a voltage-controlled oscillator (VCO) circuit, a DC voltage converter (direct current converter circuit, DC converter circuit), and so on.

Furthermore, the various exemplary embodiments are not restricted to CMOS technology, but rather can also be used in other circuit technologies such as, for example, BiCMOS technology or SiGe technology.

The electrical potential which is dependent on the radio-frequency input signal of the electronic cascode circuit can be for example identical or different in amplitude with respect to the radio-frequency input signal, but shifted by a, for example fixedly predefined, phase, for example shifted by a phase angle of 180°.

The electronic circuit, for example the electronic cascode circuit, can clearly be understood as a cascode circuit with an "oscillating" node, arranged in the "inner" well of a double-well structure, wherein the node is connected as "oscillating" earth node and is not connected to a constant reference potential.

Figure 6:
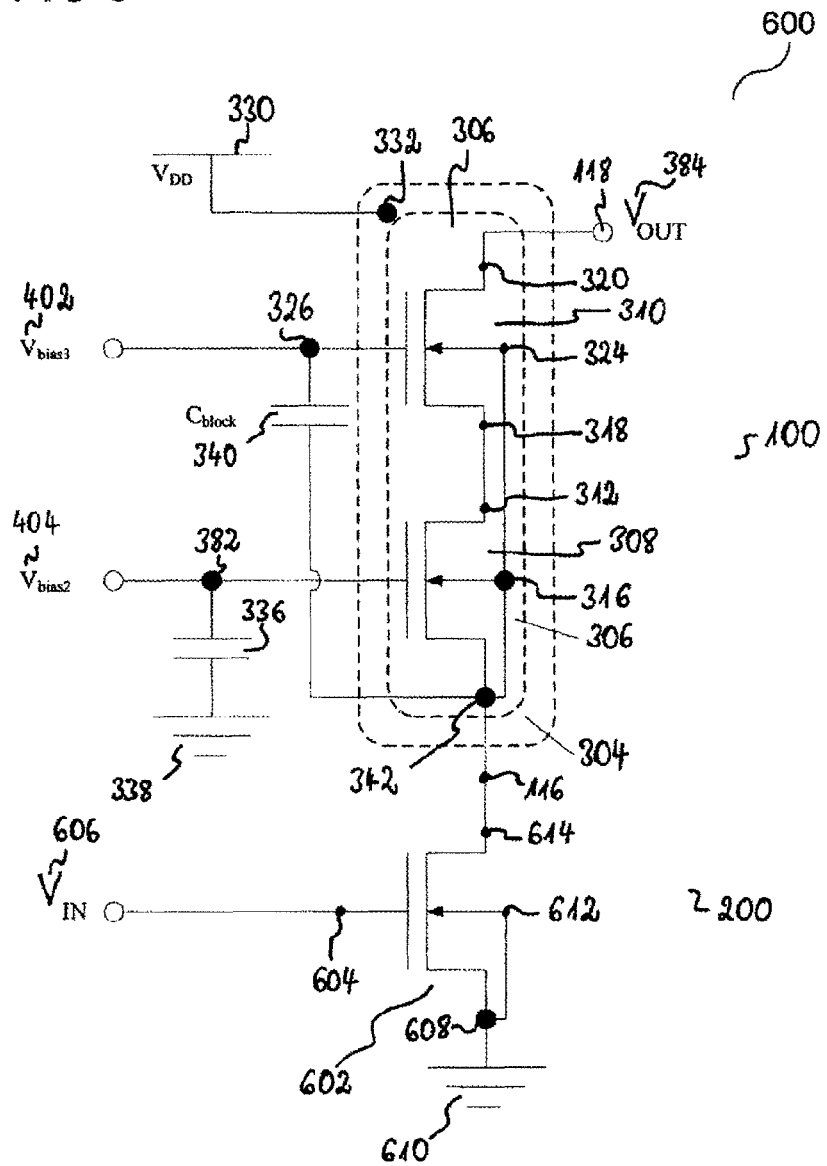

FIG. 6 shows an electronic circuit arrangement 600 in accordance with another exemplary embodiment. In accordance with this exemplary embodiment, the second circuit 200 is formed by an individual field effect transistor, for example by an n-channel MOS field effect transistor 602, to whose control terminal 604, for example to whose gate terminal 604, the radio-frequency input signal $V_{in}$ 606 is applied and whose first source/drain region 608, for example whose source region 608, is coupled to a reference potential 610, for example to the earth potential 610. A body terminal 612 of the transistor 602 is likewise coupled to the reference potential 610. In accordance with this exemplary embodiment, a second source-drain region 614 is connected to the input terminal 116 of the first cascode circuit 100. The first cascode circuit 100 has for example the structure illustrated in FIG. 3 and FIG. 4, for which reason, with regard to the detailed description of said structure, reference is made to the description of the figures concerning FIGS. 3 and 4.

The electronic cascode circuit 600 in accordance with FIG. 6 clearly represents a cascode stacked on an NMOS common-source circuit.

Figure 7:
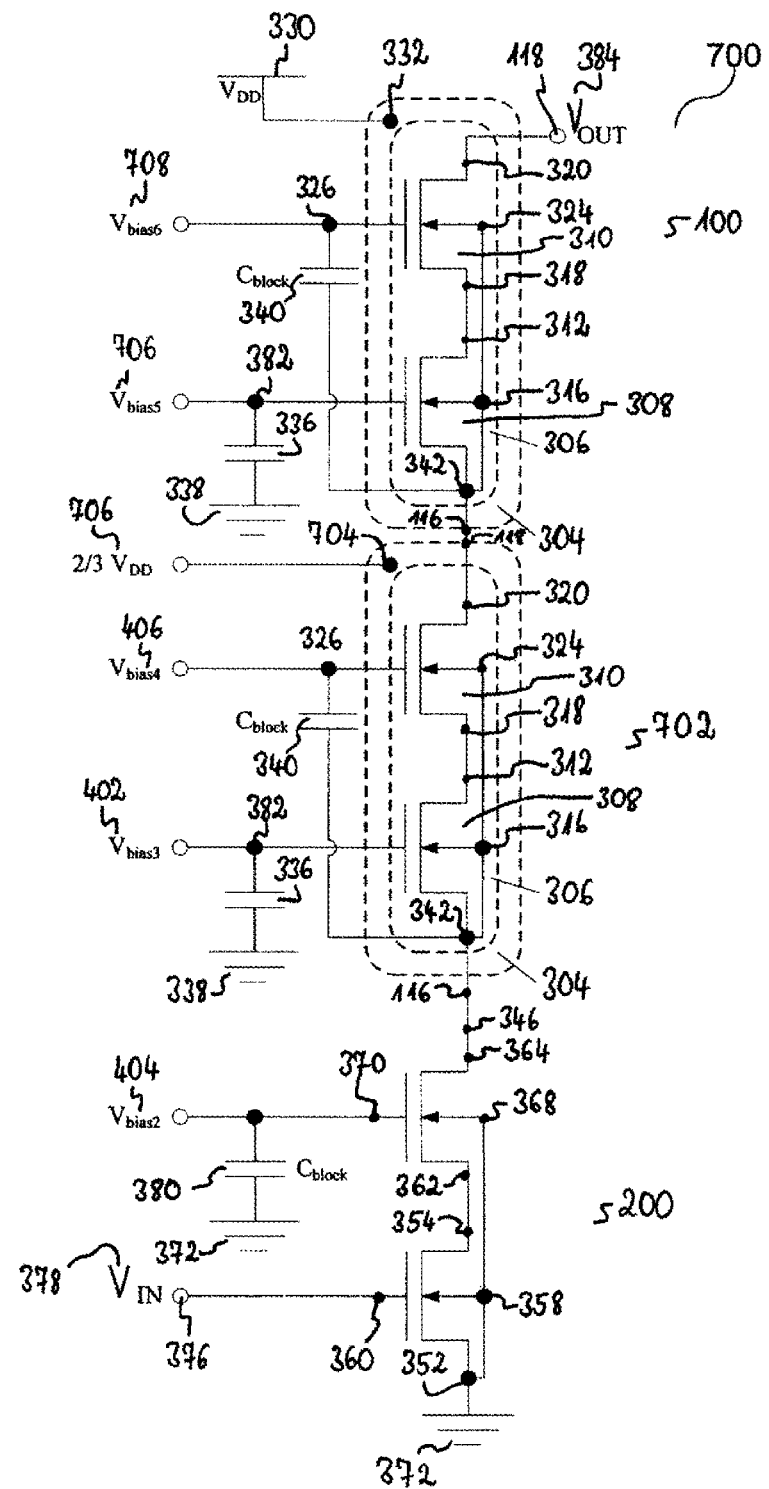

FIG. 7 shows a cascode circuit arrangement 700 in accordance with yet another exemplary embodiment of the invention.

The cascode circuit arrangement 700 in accordance with FIG. 7 has two cascode circuits 100, 702, wherein each of the two cascode circuits 100, 702 arranged in a manner stacked one above the other has the same structure as the first cascode circuit 100 as illustrated in FIG. 3 and FIG. 4.

Furthermore, the cascode circuit arrangement 700 has a third cascode circuit 702, which is identical to the second cascode circuit 200 in accordance with FIG. 3 and FIG. 4. Consequently, the circuit arrangement 700 is clearly a stacked double cascode circuit arrangement arranged in a manner stacked on a cascode circuit, clearly the second cascode circuit 200, in other words they are connected in series with the latter between the reference potential, for example the earth potential, and the output terminal 118 of the first cascode circuit 100.

Consequently, the cascode circuit arrangement 700 clearly has the first cascode circuit 100 and the second cascode circuit 200, and also a third cascode circuit 702, which is connected between the first cascode circuit 100 and the second cascode circuit 200.

The third cascode circuit 702 has the same structure as the first cascode structure 100, but, in contrast to the first cascode circuit 100, the supply potential terminal 704 of the third cascode circuit 702 is not connected to the supply potential $V_{DD}$ as in the first cascode circuit 100, but rather to a low potential, for example to $\frac{2}{3}V_{DD}$. The bias voltages which can be applied to the respective control terminals of the respective transistors can also be dimensioned identically or differently with respect to the bias voltages $V_{biasi}$ (i=2, 3, 4, 5, 6) ($V_{bias2}$ 404, $V_{bias3}$ 402, $V_{bias4}$ 406, $V_{bias5}$ 706, $V_{bias6}$ 708) in accordance with the exemplary embodiment illustrated in FIG. 3 and in FIG. 4.

Furthermore, it should be pointed out that the wells of the first cascode circuit 100 and the wells of the third cascode circuit 702 are electrically isolated from one another and are therefore electrically drivable independently of one another. Consequently, these wells can also be brought in each case to different potentials or else to the same potentials. It should be pointed out that even though the same reference symbols as for the first cascode circuit 100 are used for the elements of the third cascode circuit 702 in order to simplify the illustration and in order to avoid repetitions, these elements can, however, be dimensioned differently and the wells, as described above, can also be configured independently of one another, that is to say in a manner insulated from one another.

Figure 8:
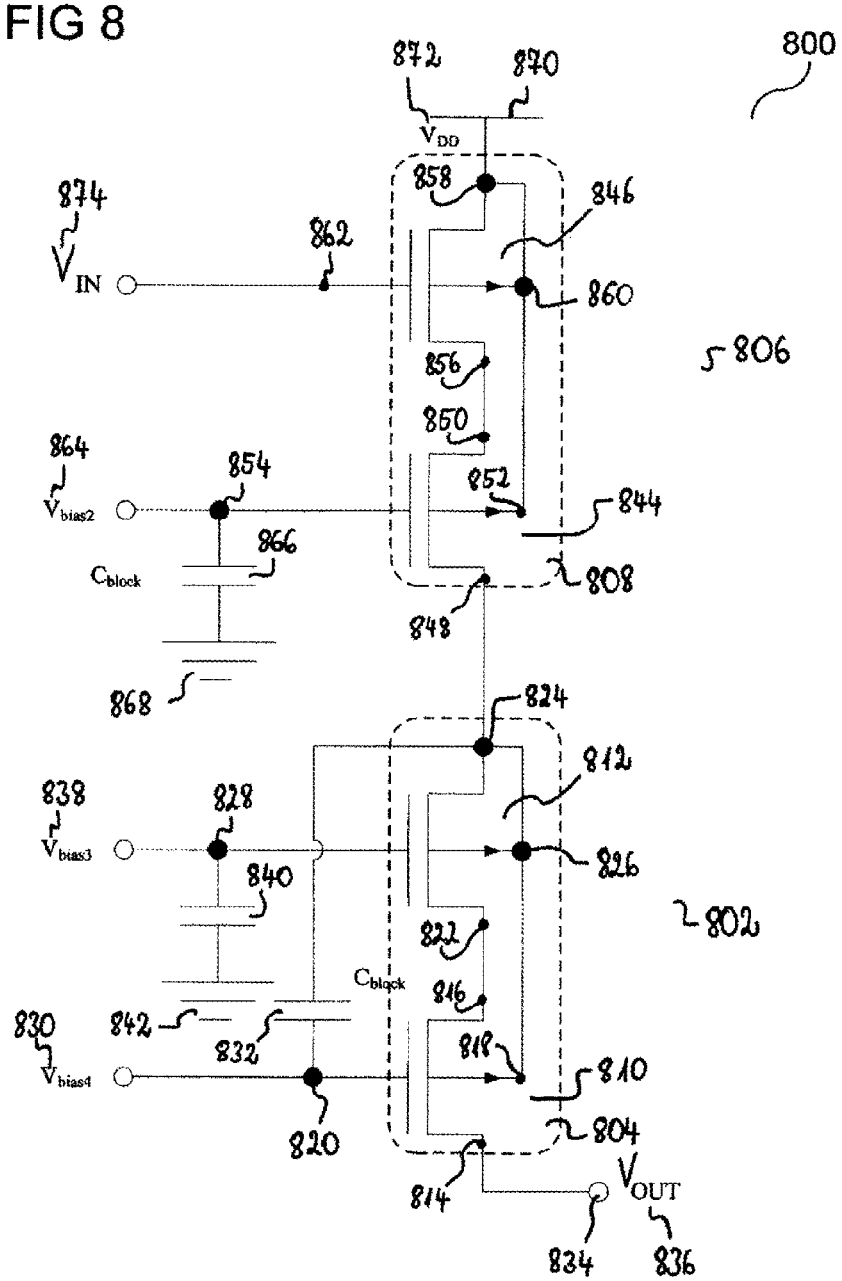

FIG. 8 shows a cascode circuit arrangement 800 in accordance with yet another exemplary embodiment of the invention.

In this exemplary embodiment, the transistors used in the cascode circuits 802, 804 are p-channel MOS field effect transistors and a double-well structure is no longer provided, rather in this case the first cascode circuit 802 is arranged in a first well 804, for example in an n-doped first well 804, and the second cascode circuit 806 is arranged in a second well 808, for example a second n-doped well 808, which is separated from the first well 804, that is to say individually drivable and isolated therefrom.

In accordance with this exemplary embodiment, the first cascode circuit 804 has a first p-channel MOS field effect transistor 810, and also a second p-channel MOS field effect transistor 812, which are both arranged in the first well 804.

In accordance with one exemplary embodiment, the first p-channel MOS field effect transistor 810 has:
- a first source/drain region 814, for example a drain region 814;
- a second source/drain region 816, for example a source region 816;
- a body region 818;
- a gate region 820, arranged on or above a gate insulation layer (not illustrated), which is arranged on or above the body region 818.

In accordance with one exemplary embodiment, the second p-channel MOS field effect transistor 812 has:
- a first source/drain region 822, for example a drain region 822;
- a second source/drain region 824, for example a source region 824;
- a body region 826;
- a gate region 828, arranged on or above a gate insulation layer (not illustrated), which, for its part, is arranged on or above the body region 818.

The gate region 820 of the first p-channel MOS field effect transistor 810 is coupled as a control terminal of the first transistor 810 to a first bias potential $V_{bias4}$ 830, which is connected for example with high resistance to the gate region 820 of the p-channel MOS field effect transistor 810, and secondly to a first terminal of a first blocking capacitor 832, the second terminal of which is coupled to the second source/drain region 824 of the second p-channel MOS field effect transistor 812 in the first well 810.

The first source/drain region 814 of the first p-channel MOS field effect transistor 810 is furthermore coupled to an output terminal 834, at which an output voltage $V_{OUT}$ 836 is provided.

Furthermore, the gate region 828 of the second p-channel MOS field effect transistor 812 is coupled as control terminal thereof firstly to a second bias potential $V_{bias3}$ 838 and furthermore to a first terminal of a tuning capacitor 840 having the capacitance $C_{Tuning}$, the second terminal of which is coupled to a reference potential 842, for example the earth potential 842.

The first cascode circuit 802 is connected in series with the second cascode circuit 806.

The second cascode circuit 806 likewise has two p-channel MOS field effect transistors, for example a third p-channel MOS field effect transistor 844 and a fourth p-channel MOS field effect transistor 846.

In accordance with this exemplary embodiment, the third p-channel MOS field effect transistor 844 has:
- a first source/drain region 848, for example a drain region 848;
- a second source/drain region 850, for example a source region 850;
- a body region 852; and
- a gate region 854, arranged on or above a gate insulation layer (not illustrated), which, for its part, is arranged on or above the body region 852.

In accordance with one exemplary embodiment, the fourth p-channel MOS field effect transistor 846 has:
- a first source/drain region 856, for example a drain region 856;
- a second source/drain region 858, for example a source region 858;
- a body region 860; and
- a gate region 862, arranged on or above a gate insulation layer (not illustrated), which, for its part, is arranged on or above the body region 860.

The gate region 854 of the third p-channel MOS field effect transistor 844 is coupled as control terminal thereof firstly to a third bias potential $V_{bias2}$ 864 and furthermore to a first terminal of a second blocking capacitor 866 having the capacitance $C_{block}$.

The second terminal of the second blocking capacitor 866 is coupled to a reference potential 868, for example the earth potential 868.

Furthermore, the source terminal 858 of the fourth p-channel MOS field effect transistor 846 is coupled to a supply potential terminal 870, to which the supply potential $V_{DD}$ is applied. Furthermore, the gate region 862 of the fourth p-channel MOS field effect transistor 846 is coupled as control terminal of the fourth p-channel MOS field effect transistor 846 to the radio-frequency input signal $V_{in}$ 874.

Figure 9:
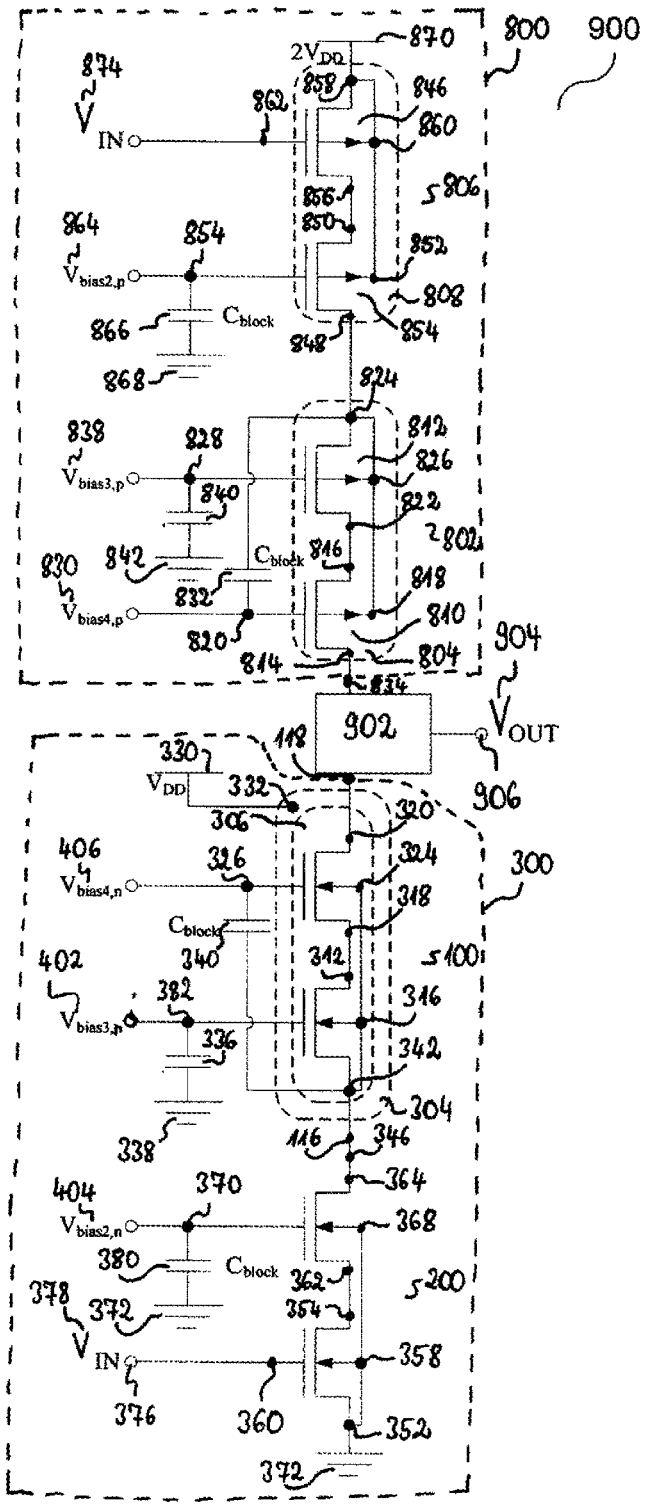

FIG. 9 shows a cascode circuit arrangement 900 in accordance with yet another exemplary embodiment of the invention. This exemplary embodiment clearly constitutes a stacked n-channel MOS field effect transistor and p-channel MOS field effect transistor cascode circuit with an output signal provided at a centre tap.

In accordance with this exemplary embodiment, the cascode circuit arrangement 900 has a first partial cascode circuit arrangement 300 as illustrated in FIG. 3 and in FIG. 4, and also a second partial cascode circuit arrangement 800 as illustrated in FIG. 8, wherein the output terminal 834 of the second partial cascode circuit arrangement 800 is coupled to a centre tap 902, to which the output terminal 118 of the first cascode circuit 100 of the first partial cascode circuit arrangement 300 is likewise coupled.

At the centre tap 902, an output signal $V_{OUT}$ 904 is provided at an output terminal 906.

The further elements of the cascode circuit arrangement 900 are the same as illustrated in the respective cascode circuit arrangements 300 and 800, and, for this reason, will not be described in detail again in order to avoid repetitions.

It is pointed out, however, that the source terminal 858 of the fourth p-channel MOS field effect transistor 846 of the second partial cascode circuit arrangement 800 is not coupled to the supply potential $V_{DD}$, but rather to twice the supply potential $V_{DD}$.

It should be pointed out that other circuits can also be provided as a second circuit 200 in alternative exemplary embodiments, for example with one or a plurality of correspondingly interconnected transistors or other electronic components. The individual transistors can also be arranged in stacked fashion.

FIG. 10 shows a flowchart 100 illustrating a method for producing an electronic cascode circuit. A first transistor is formed in 1002. A second transistor is formed in 1004. Furthermore, a capacitor is formed in 1006, wherein a first terminal of the capacitor is coupled to a control terminal of the second transistor, and wherein a second terminal of the capacitor is coupled to an electrical potential which is dependent on a radio-frequency input signal of the electronic cascode circuit.

FIG. 11 shows a further flowchart 1100 illustrating a method for producing an electronic cascode circuit arrangement. In accordance with this method, a first cascode circuit is formed. In order to form the first cascode circuit, a first transistor is formed in 1102 and a second transistor is formed in 1104. Furthermore, a capacitor is formed in 1106, wherein a first terminal of the capacitor is coupled to a control terminal of the second transistor, and wherein a second terminal of the capacitor is coupled to an electrical potential which is dependent on a radio-frequency input signal of the electronic cascode circuit. Furthermore, in accordance with the method, a second circuit is formed in 1108, said second circuit being coupled to an input terminal of the first cascode circuit.

It should be pointed out that the exemplary embodiments described above can be used in any transistor technology for increasing the dielectric strength of a circuit compared with the dielectric strength of an individual transistor.

Although the invention has been shown and described primarily in connection with specific exemplary embodiments, it should be understood by those persons who are familiar with the technical field that diverse modifications of the configuration and details thereof can be implemented without departing from the essence and scope of the invention as defined by the following claims. The scope of the invention is therefore determined by the appended claims, and the intention is for all changes that lie within the scope of the meaning and the range of equivalence of the claims to be encompassed by the claims.

The invention claimed is:

1. Electronic cascode circuit, comprising:
   a first transistor having a control terminal and first and second controlled terminals, the first controlled terminal of the first transistor coupled to an electrical potential which is dependent on a radio-frequency input signal of the electronic cascode circuit;
   a second transistor having a control terminal;
   a capacitor, wherein a first terminal of the capacitor is coupled to the control terminal of the second transistor, and wherein a second terminal of the capacitor is coupled to the first controlled terminal of the first transistor; and
   an additional capacitor, wherein a first terminal of the additional capacitor is coupled to the control terminal of the first transistor, and wherein a second terminal of the additional capacitor is coupled to earth potential, the additional capacitor providing capacitive coupling of a gate region associated with the first transistor to the earth potential.

2. Electronic cascode circuit according to claim 1,
   wherein the first transistor and/or the second transistor are/is configured as field effect transistor or as bipolar transistor.

3. Electronic cascode circuit according to claim 1,
   wherein the first transistor and/or the second transistor are/is configured as MOS field effect transistor.

4. Electronic cascode circuit according to claim 1, furthermore comprising:
   a substrate;
   a first well, doped with dopants of a first conductivity type, in the substrate;
   a second well, doped with dopants of a second conductivity type, which is different from the first conductivity type, wherein the second well is arranged in the first well;
   wherein the first transistor and the second transistor are arranged in the second well.

5. Electronic cascode circuit according to claim 4,
   wherein the second terminal of the capacitor is coupled to the well potential of the second well.

6. Electronic cascode circuit according to claim 5,
   wherein the first conductivity type is an n conductivity type; and
   wherein the second conductivity type is a p conductivity type.

7. Electronic cascode circuit according to claim 6,
   wherein the first transistor and the second transistor are n-channel field effect transistors.

8. Electronic cascode circuit according to claim 4,
   wherein the first conductivity type is a p conductivity type; and
   wherein the second conductivity type is an n conductivity type.

9. Electronic cascode circuit according to claim 8,
   wherein the first transistor and the second transistor are p-channel field effect transistors.

10. Electronic cascode circuit according to any of claim 4, furthermore comprising:
    a supply potential terminal for applying a supply potential, wherein the supply potential terminal is electrically coupled to the first well.

11. Electronic cascode circuit arrangement, comprising:
    a first cascode circuit, which comprises:
    a first transistor having a control terminal, and first and second controlled terminals, the first controlled terminal of the first transistor coupled to an electrical potential which is dependent on a radio-frequency input signal of the electronic cascode circuit arrangement;
    a second transistor; and
    a capacitor, wherein a first terminal of the capacitor is coupled to the a control terminal of the second transistor, and wherein a second terminal of the capacitor is coupled to the first controlled terminal of the first transistor;
    an additional capacitor, wherein a first terminal of the additional capacitor is coupled to the control terminal of the first transistor, and wherein a second terminal of the additional capacitor is coupled to earth potential, the additional capacitor providing capacitive coupling of a gate region associated with the first transistor to the earth potential; and
    a second circuit, which is coupled to an input terminal of the first cascode circuit.

12. Electronic cascode circuit arrangement according to claim 11,
    wherein the second circuit is designed for receiving the radio-frequency input signal.

13. Electronic cascode circuit arrangement according to claim 11,
    wherein the second circuit has at least one transistor, wherein a control terminal of the at least one transistor is coupled to the radio-frequency input signal.

14. Electronic cascode circuit arrangement according to claim 11,
wherein the second circuit is a second cascode circuit.

15. Electronic cascode circuit arrangement according to claim 14,
wherein the second cascode circuit has:
a first transistor;
a second transistor; and
a capacitor, wherein a first terminal of the capacitor is coupled to a control terminal of the second transistor, and wherein a second terminal of the capacitor is coupled to an electrical reference potential.

16. Electronic cascode circuit arrangement according to claim 15,
wherein the control terminal of the first transistor of the second cascode circuit is coupled to the radio-frequency input signal.

17. Electronic cascode circuit arrangement according to claim 11,
wherein the first transistor of the first cascade circuit and/or the second transistor of the first cascade circuit are/is configured as field effect transistor or as bipolar transistor.

18. Electronic cascode circuit arrangement according to claim 15,
wherein the first transistor of the second cascode circuit and/or the second transistor of the second cascode circuit are/is configured as field effect transistor or as bipolar transistor.

19. Electronic cascode circuit arrangement according to claim 11,
wherein the first transistor of the first cascode circuit and/or the second transistor of the first cascode circuit are/is configured as MOS field effect transistor.

20. Electronic cascode circuit arrangement according to claim 15,
wherein the first transistor of the second cascode circuit and/or the second transistor of the second cascode circuit are/is configured as MOS field effect transistor.

21. Electronic cascode circuit arrangement according to claim 11, furthermore comprising:
a substrate;
a first well, doped with dopants of a first conductivity type, in the substrate;
a second well, doped with dopants of a second conductivity type, which is different from the first conductivity type, wherein the second well is arranged in the first well;

wherein the first transistor of the first cascode circuit and the second transistor of the first cascode circuit are arranged in the second well.

22. Electronic circuit, comprising:
a first transistor having a first controlled terminal coupled to an electrical potential which is dependent on a radio-frequency input signal of the electronic circuit;
a second transistor coupled in series with the first transistor;
a capacitor, wherein a first terminal of the capacitor is coupled to a control terminal of the second transistor, and wherein a second terminal of the capacitor is coupled to the first controlled terminal; and
an additional capacitor, wherein a first terminal of the additional capacitor is coupled to a control terminal of the first transistor, and wherein a second terminal of the additional capacitor is coupled to earth potential, the additional capacitor thereby providing capacitive coupling of a gate region associated with the first transistor to the earth potential.

23. Electronic circuit according to claim 22,
wherein the first transistor and/or the second transistor are/is configured as MOS field effect transistor.

24. Electronic circuit arrangement, comprising:
a first circuit, which comprises:
a first transistor having a first controlled terminal coupled to an electrical potential which is dependent on a radio-frequency input signal of the electronic circuit;
a second transistor coupled in series with the first transistor;
a capacitor, wherein a first terminal of the capacitor is coupled to a control terminal of the second transistor, and wherein a second terminal of the capacitor is coupled to the first controlled terminal of the first transistor;
an additional capacitor, wherein a first terminal of the additional capacitor is coupled to a control terminal of the first transistor, and wherein a second terminal of the additional capacitor is coupled to earth potential, the additional capacitor providing capacitive coupling of a gate region associated with the first transistor to the earth potential; and
a second circuit, which is coupled to an input terminal of the first circuit.

25. The electric circuit arrangement according to claim 24,
wherein the additional capacitor is coupled directly to the earth potential.

* * * * *

UNITED STATES PATENT AND TRADEMARK OFFICE
CERTIFICATE OF CORRECTION

PATENT NO.        : 8,994,449 B2                                   Page 1 of 1
APPLICATION NO.   : 12/690009
DATED             : March 31, 2015
INVENTOR(S)       : Hodel et al.

It is certified that error appears in the above-identified patent and that said Letters Patent is hereby corrected as shown below:

On the Title page, in item (65), in "Prior Publication Data", in column 1, line 1, after "Jan. 27, 2011", insert --¶(30) Foreign Application Priority Data
Jan. 19, 2009   (DE)   102009005120.1--, therefor Signed and Sealed this
Twenty-sixth Day of January, 2016

Michelle K. Lee
*Director of the United States Patent and Trademark Office*